(12) United States Patent
Ellison

(10) Patent No.: US 7,306,377 B2
(45) Date of Patent: Dec. 11, 2007

(54) INTEGRATED OPTICAL SUB-ASSEMBLY HAVING EPOXY CHIP PACKAGE

(75) Inventor: Thomas Lee Ellison, San Jose, CA (US)

(73) Assignee: Finisar Corporation, Sunnyvale, CA (US)

( * ) Notice: Subject to any disclaimer, the term of this patent is extended or adjusted under 35 U.S.C. 154(b) by 111 days.

(21) Appl. No.: 10/836,134

(22) Filed: Apr. 30, 2004

(65) Prior Publication Data

US 2005/0244095 A1  Nov. 3, 2005

(51) Int. Cl.
*G02B 6/36* (2006.01)

(52) U.S. Cl. ............... 385/88; 385/14; 385/93; 385/89; 385/92

(58) Field of Classification Search .......... 353/88, 353/14, 135, 92, 89, 93; 398/23; 439/61
See application file for complete search history.

(56) References Cited

U.S. PATENT DOCUMENTS

| | | | |
|---|---|---|---|
| 4,733,094 A * | 3/1988 | Carpentier et al. ......... 257/82 |
| 6,027,255 A * | 2/2000 | Joo et al. .................. 385/88 |
| 6,091,475 A * | 7/2000 | Ogino et al. .............. 257/693 |
| 6,130,972 A * | 10/2000 | Shiraishi et al. ........... 385/33 |
| 6,164,838 A * | 12/2000 | Maehara et al. ........... 385/92 |
| 6,461,059 B2 * | 10/2002 | Ando et al. ............... 385/94 |
| 6,485,322 B1 * | 11/2002 | Branch et al. ............ 439/357 |
| 6,712,527 B1 * | 3/2004 | Chan et al. ............... 385/88 |
| 6,726,375 B2 * | 4/2004 | Kato et al. ............... 385/88 |
| 6,835,923 B2 * | 12/2004 | Hamalainen et al. ....... 385/31 |
| 6,905,260 B2 * | 6/2005 | Anderson et al. .......... 385/91 |
| 7,008,119 B2 * | 3/2006 | Mizue et al. .............. 385/88 |
| 2001/0024549 A1 * | 9/2001 | Takahashi et al. ......... 385/49 |
| 2002/0122637 A1 * | 9/2002 | Anderson et al. .......... 385/89 |
| 2002/0197026 A1 * | 12/2002 | Kato et al. ............... 385/92 |
| 2003/0098511 A1 * | 5/2003 | Moon et al. ............... 257/778 |
| 2003/0113076 A1 * | 6/2003 | Naka et al. ............... 385/92 |
| 2003/0123819 A1 * | 7/2003 | Nakanishi et al. ......... 385/88 |
| 2003/0137022 A1 * | 7/2003 | Dautartas et al. .......... 257/432 |
| 2004/0007784 A1 * | 1/2004 | Skipor et al. ............. 257/788 |
| 2004/0057648 A1 * | 3/2004 | Yunus .................... 385/14 |
| 2005/0245103 A1 * | 11/2005 | Ellison .................... 439/61 |

* cited by examiner

*Primary Examiner*—Frank G. Font
*Assistant Examiner*—James P. Hughes
(74) *Attorney, Agent, or Firm*—Workman Nydegger

(57) ABSTRACT

An optical sub-assembly includes a circuit and one or more electronic components electrically connected to the circuit. One of the electronic components is an optoelectronic device capable of transmitting or receiving light signals. Mounted to a surface of the optoelectronic device is an optical conduit. A first end of the optical conduit mounts to the optoelectronic device and a second end optionally cooperates with an optical component, such as a lens. The optical conduit channels light signals propagating toward or away from the optoelectronic device, while the optical component focuses or collimates such light signals. Securing the optical conduit relative to the optoelectronic device is a protective material such as a resin, epoxy, or other suitable material.

28 Claims, 3 Drawing Sheets

INTEGRATED OPTICAL SUB-ASSEMBLY HAVING EPOXY CHIP PACKAGE

CROSS-REFERENCE TO RELATED APPLICATIONS

This application is related to U.S. Utility application Ser. No. 10/836,728, dated Apr. 30, 2004 and entitled "Transceiver Module Having a Flexible Circuit", which is incorporated by reference in its entirety.

BACKGROUND OF THE INVENTION

1. The Field of the Invention

Exemplary embodiments of the present invention relate to the field of optical sub-assemblies, and more particularly, to optical sub-assemblies having a chip package that is coated with a resin.

2. The Relevant Technology

Transceiver modules come in a variety of shapes and sizes depending on the specific function they are designed to perform. Optoelectronic transceiver modules typically contain a transmitter optical sub-assembly (TOSA), a receiver optical sub-assembly (ROSA), and a printed circuit board (PCB) that controls the TOSA and ROSA. This PCB also connects the transceiver module to external devices using the various electrical circuits associated with the PCB.

Various standards setting organizations define the size and shape of optical transceivers. As with most electronic components, over the past several years the size of optical transceivers has been shrinking as electronics engineers fit more and more electrical circuitry into smaller and smaller packages. Unfortunately, as the number of electrical components and the tolerances between components on a PCB increases, and particularly as the density of these components increases, the manufacturing complexity and expense correspondingly increase.

PCBs are typically composed of a substrate, such as glass, plastic, or silicon, on which are printed or etched electrical circuits. In an attempt to alleviate the complexity and expense associated with filling one side of a PCB with circuits, designers can put circuits on both sides of the PCB. While this helps ease the premium on space, it even further complicates the manufacturing process.

Additionally, no matter how small PCBs become, they have limited space to receive electrical circuits. Also, the size of the PCB is limited by the size of the transceiver package; this size governed by industry standards. Even with sophisticated techniques to pack the most electrical circuitry possible onto the PCB, the physical space limitations presented by the device standards cannot be overcome. As the density of the circuitry increases, the costs of manufacture increase substantially.

Providing an optimal connection between a TOSA and/or a ROSA and a PCB can be difficult. For example, within a transceiver module, the TOSA and the ROSA must be positioned within small tolerances to achieve the desired optical performance. Similarly, the PCB must typically be precisely positioned for its connections to adjacent devices. Adding a third layer of rigid alignment requirements (the PCB to the TOSA and/or ROSA) makes accurately positioning the internal components difficult. Additionally, the TOSA and the ROSA often experience vibration and movement as optical cables are moved, attached, and detached. The PCB may be damaged or even crack if it rigidly attaches to the TOSA and/or ROSA at one end and a transceiver module housing at the other end. Thermal contraction or expansion can also cause problems if the devices are rigidly attached.

To eliminate some problems with manufacturing a transceiver, flexible circuits may be disposed between the TOSA and/or ROSA and the PCB. The flexible circuit electrically interconnects the TOSA, ROSA, and PCB while isolating the PCB from vibration, thermal expansion or contraction of the adjacent devices. During production, the PCB may be mechanically fixed in place while the TOSA and/or ROSA are free to move. Use of the flexible circuit accommodates for variations in device subassembly position and enables precise connection and alignment of the TOSA, ROSA, and the PCB.

To contain and protect the active devices of the TOSA and/or ROSA, the TOSA and/or ROSA include a transistor-outline (TO) header and associated cap. The TO header allows the electrical connection of the active devices in the TOSA and/or ROSA to the PCB, such as by way of a flexible circuit board or otherwise. With respect to their construction, TO headers often include a cylindrical metallic base with a number of conductive pins extending completely through, and generally perpendicular to, the base. One conventional method of conductively connecting a flexible circuit to a TO header includes pins on the TO header that connect to reinforced openings on one end of the flexible circuit, which are then soldered to affix the flexible circuit and ensure reliable connections. In turn, the other end of the flexible circuit attaches to "finger" like traces on the rigid PCB, via soldering or otherwise. Such soldered contacts are typically aligned in a linear row along the edge of the PCB.

The general construction of such an optoelectronic module 100 is shown in FIG. 1. Optoelectronic module 100 includes a TOSA 102 and a ROSA 104 that connect to a printed circuit board 106. A first flexible circuit 108 interconnects TOSA 102 and printed circuit board 106, while a second flexible circuit 110 interconnects ROSA 104 and printed circuit board 106. Also depicted as part of module 100 are housing 112 for containing the electrical components of module 100, Lucent Connector (LC) cable receptacles 116, or other fiber optic cable connectors such as standard connectors (SC), for receiving and securely attaching LC cables (not shown) to TOSA 102 and ROSA 104.

The entire optoelectronic module 100 connects to a computer system that controls the operation of the transceiver module. The computer system, such as a host system, can direct module 100 to transmit an optical signal by directing an electronic signal through PCB 106 and into TOSA 102. The TOSA 102 then generates an optical signal via an internal laser or light emitting diode (LED) that propagates into an outgoing optical cable at port 116. Similarly, ROSA 104 receives an optical signal via a photodiode from the incoming optical cable at port 116 and transmits the signal to PCB 106 and on to the computer system. Specific details of the connection of flexible circuits to PCBs can be found in co-pending and co-owned U.S. patent application Ser. No. 10/409,837, filed on Apr. 9, 2003 and entitled "Flexible Circuit for Establishing Electrical Connectivity with Optical Sub-Assembly", which is incorporated herein by reference in its entirety.

One problem associated with the design shown in FIG. 1 is that the connections between flex circuit 108, PCB 106, and TOSA 102 can be difficult and time consuming to make. Likewise, the connections between flex circuit 110, PCB 106 and ROSA 104 can also be difficult and time consuming to make. This increased time and complexity greatly increases the cost of the modules as a whole.

BRIEF SUMMARY OF THE EXEMPLARY EMBODIMENTS

In order to overcome the limitations discussed above, exemplary embodiments of the present invention disclose an optical sub-assembly that eliminates the need for a TO-cap. According to one aspect, the optical sub-assembly includes an optoelectronic device, such as a laser transmitter or photodiode receiver. Cooperating with the optoelectronic device is an optical conduit having a first end and a second end. The first end mounts to the optoelectronic device, while the second end can optionally receive an optical component. The optical conduit channels signals to or away from the optoelectronic device. The optical component, such as a lens, aids with this channeling function. To maintain the optical component relative to the optoelectronic device, at least a portion of the optical conduit and the optoelectronic device are covered with a protective material, such as, for example, a resin or an epoxy. The resin or epoxy can be optically transparent.

According to another aspect of exemplary embodiments of the present invention, the optical subassembly includes a laser diode and a cylindrical member having a first end abutting the laser diode. Additionally, there can be a protective material covering the laser diode and at least a portion of the cylindrical member such that the protective material does not interfere with a light signal transmitted from the laser diode. In this manner, the optoelectronic device can eliminate the need to precisely align a TO-cap with the laser transmitter or photodiode receiver of the module. Further, the materials used to fabricate the module are less expensive than those used to fabricate and mount a TO-cap to a TO-header of a TOSA or ROSA.

According to yet another aspect of exemplary embodiments of the present invention, the optical subassembly includes a photodiode and a cylindrical member having a first end abutting the photodiode. Additionally, there can be a protective material covering the photodiode and at least a portion of the cylindrical member such that the protective material does not interfere with a light signal transmitted to the photodiode.

These and other objects and features of the present invention will become more fully apparent from the following description and appended claims, or may be learned by the practice of the invention as set forth hereinafter.

BRIEF DESCRIPTION OF THE DRAWINGS

To further clarify the above and other advantages and features of the present invention, a more particular description of the invention will be rendered by reference to specific embodiments thereof which are illustrated in the appended drawings. It is appreciated that these drawings depict only typical embodiments of the invention and are therefore not to be considered limiting of its scope. The invention will be described and explained with additional specificity and detail through the use of the accompanying drawings in which.

DETAILED DESCRIPTION OF THE EXEMPLARY EMBODIMENTS

Reference will now be made to FIGS. 2-5 wherein like structures will be provided with like reference designations. It is to be understood that the figures are diagrammatic and schematic representations of various embodiments of the claimed invention, and are not to be construed as limiting the scope of the present invention in any way, nor are the figures necessarily drawn to scale.

Figure 1:
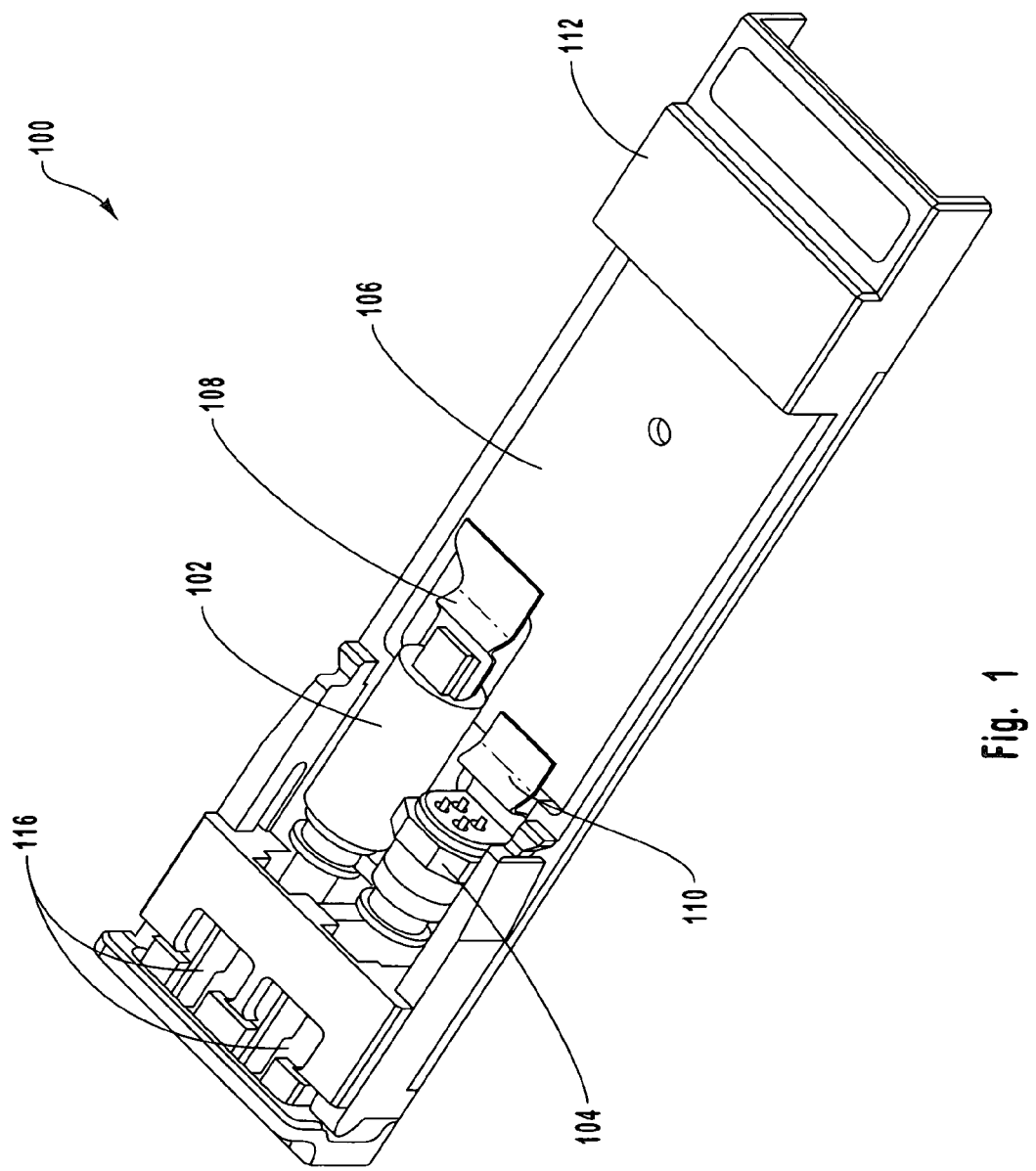
FIG. 1 illustrates a perspective view of a typical optoelectronic module with a printed circuit board.
Figure 2A:
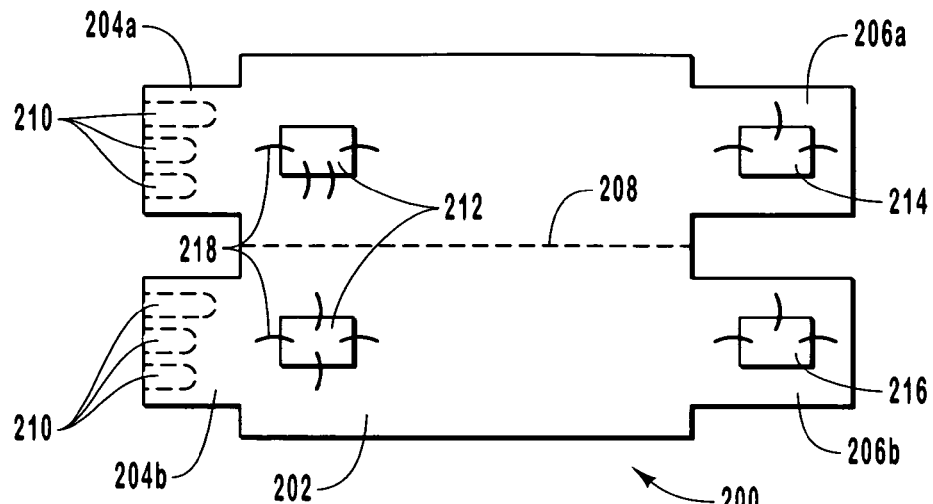
FIG. 2A shows a top view of a flexible circuit in accordance with one exemplary embodiment of the present invention.
Figure 2B:
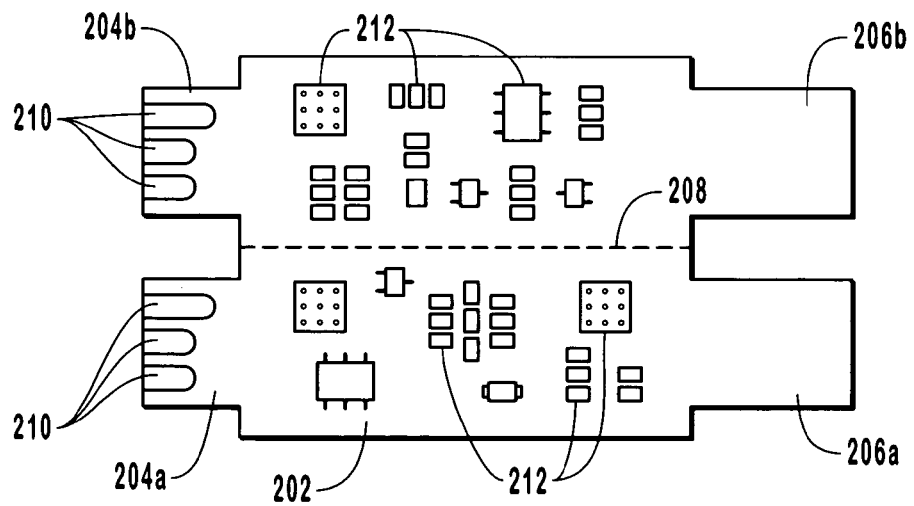
FIG. 2B shows one possible bottom view of the flexible circuit of FIG. 2.

With reference to FIGS. 2A and 2B, a flexible circuit 200 is shown. Flexible circuit 200 can be produced in several basic forms. These include, for example, single-sided flexible circuits, double-sided flexible circuits, and multilayer flexible circuits (having three or more conductor layers); the layers of the circuit interconnected with plated-through holes. Flexible circuit 200 includes a flexible member 202 that acts as a substrate for the electrical components mounted thereon. Generally, flexible circuit 200 is a patterned arrangement of electrical pathways deposited on flexible member 202, which has a flexible base material with or without flexible cover layers. The combination of flexible member 202 with the electrical traces, wires, waveguides, strips, slot lines, or the like formed in or deposited on the flexible member 202 may be considered flexible circuit 200. Further, flexible circuit 200 can also include the various electrical components mounted thereto.

In this exemplary embodiment, flexible member 202 has first and second elongated sections 204a, 204b on one end, and third and fourth elongated sections 206a, 206b, on an opposite end. Disposed on flexible member 202 are one or more electrical components 212, a laser 214, and a photodiode 216. It will be understood that the laser and the photodiode are also "electrical components" or "components". A plurality of wires 218 connects these components to electrical conductors in flexible member 202. Additionally, disposed on flexible member 202 are electrical connectors or pads 210 for connecting flexible circuit 200 to external devices, such as a router, network switch, mass storage device, computer, or other electrical component.

Flexible member 202 can be manufactured using a variety of materials such as polyimide, polyester, LCP, Teflon, or other material having the desired flexibility and strength characteristics. The specific flexible circuit embedded in flexible member 202 can be a waveguide design (for example microstrip, coplanar waveguide, slotline, or the like) to confine and propagate electromagnetic waves along flexible circuit 200. Microstrips have an unbalanced transmission trace structure. In one configuration, this structure can include a ground plane, such as a layer of copper or other conductive material, on the back side of a substrate of flexible circuit 202. This structure can further include the dielectric material of flexible circuit 202, and a relatively narrow strip on the top side of flexible circuit 202. When a microstrip is used with a 10 Gig circuit, the controlled impedance lines can be used for all signal lines of the circuit. These narrow strips can be the controlled impedance lines and can extend, in one example, from the photodiode to the post amplifier. Coplanar waveguides, as their name suggests, are formed on the planar surface of flexible circuit 202 with ground areas which parallel a signal trace on both sides of flexible circuit 202. One exemplary embodiment of the present invention uses microstrip or coplanar waveguide designs. However, any flexible circuit waveguide structure may be compatible with various aspects of the embodiments of the present invention.

To ensure that electrical components 212 function correctly, the proper impedance is chosen for flexible circuit 200. In the case of a microstrip, the impedance of a microstrip is determined by the width of the trace above the ground plane, the thickness of the substrate, and the dielectric of the substrate. For a coplanar waveguide, the impedance of a coplanar waveguide is determined by the overall size of the signal trace, substrate thickness and dielectric, and the width of the gaps on either side. Such design considerations are known to and routinely made by, one skilled in the art.

The specific exemplary configuration of flexible member 202 shown in FIGS. 2A and 2B can facilitate the placement of components on flexible member 202. This enables the folding and operation of flexible circuit 200. Although FIGS. 2A and 2B illustrate one configuration of flexible member 202, which allows for the performance of the flexible member 202, other configurations that allow for the connection of electrical components on flexible member 202, and that allow the flexible material to be folded to fit within the space provided in a module, are also possible. For instance, flexible member 202 can be square, rectangular, polygonal, circular, oval, or any other shape. The specific shape shown in FIGS. 2A and 2B is an exemplary embodiment only, and should not be construed to limit the invention in any way.

Each of the one or more electrical components 212 can be any of a number of standard or special purpose electrical devices forming part of flexible circuit 200. By way of example and not limitation, each of the one or more electrical components 212, illustrated in FIGS. 2A and 2B, can be a laser driver for laser 214, a post amplifier for photodiode 216, insulation displacement components (IDC), surface mount technology (SMT) components, chip-on-board (COB) components, resistors, capacitors, transducers, or other electrical components.

In the exemplary embodiment of FIG. 2A, electrical components 212 are COB components that can be placed on the surface(s) that will be folded to the inside of the folded flexible circuit 200. Regular "off the shelf" SMT components can also be placed on the surface that faces outward after folding flexible member 202, shown in FIG. 2B. Those skilled in the art will realize that this need not be the case, and any type of electrical component 212 can be placed anywhere on flexible member 202. The placement of certain electrical components 212 may be affected by the manufacturing process used to place or mount the electrical component.

In one configuration each type of component is placed by a different kind of equipment during the manufacturing process. Illustratively, COB process can involve taking an unpackaged semiconductor die, gluing it on flexible member 202, wirebonding the electrical connection to pads, such as, but not limited to, gold or other metallic pads, on flexible member 202, and then adding epoxy or resin potting material over the wirebonds and die to protect it from damage. The epoxy or resin potting material is sometimes known as "glop-top" material. The COBs are usually semiconductors designed and manufactured for a specific company. Such semiconductors are sometimes known as Application Specific Integrated Circuits (ASICs).

Utilizing the COB process reduces costs and eliminates paying third parties to pre-package the ASICs into an SMT package and mount the SMT package. FIG. 2B shows a number of SMT electrical components 212 mounted on a reverse side of flexible member 202 from the COBs. Each of electrical components 212 (whether COB, SMT or some other type of electrical component) can be fixed to the surface of flexible member 202 using, for example, adhesives designed for that or other purposes. Additionally, the components can be attached with solder, or any other attachment method that will fix electrical components 212 on flexible material 202.

In an alternate exemplary embodiment, SMT components can be attached to flexible member 202 by screen-printing solder paste on metal pads (not shown) plated on flexible member 202. The metal pads can be, by way of example and not limitation, gold, or silver, solder coated pads, or other metallic pads, whether coated or uncoated. Surface mount devices (SMDs) can be placed in the solder paste usually by an automated, vision controlled, and placement machine. The solder paste can act as a temporary adhesive to hold the parts on the board. After component placement, the assembly can pass into an oven, which heats the entire assembly to above the melting point of the solder, causing the solder to melt and mass form all of the solder joints. Alternately, conductive adhesive can be used instead of solder paste. The SMD components can be placed in the conductive adhesive and the assembly sent through an oven (much lower temperature than for soldering) where the conductive adhesive cures, bonding the components to the board. Such conductive adhesive can be, by way of example and not limitation, a silver loaded epoxy.

With continued reference to FIGS. 2A and 2B, each of the electrical components 212 can have one or more connecting wires 218. Connecting wires 218 bond to flexible member 202 of flexible circuit 200 using techniques known to those of skill in the art. These techniques can include, by way of example and not limitation, gold wire bonding to the electrical components 212 and to gold pads (not shown) plated on flexible material 202. Other types of metal or alloy wires and pads can also be used, whether or not the type of metal or alloy for the wire is the same as the type of metal for the pad. Illustratively, and in no way limiting the possibility of other metals or alloys, aluminum wire could be used to bond to the gold pads plated on flexible material 202. Wire bonding can occur, by way of example and not limitation, thermosonically, ultrasonically or thermally, using standard wirebonding equipment. Alternately, or in addition to wires 218, certain electrical components 212 can contact one or more traces to make the desired electrical connection.

Figure 3:
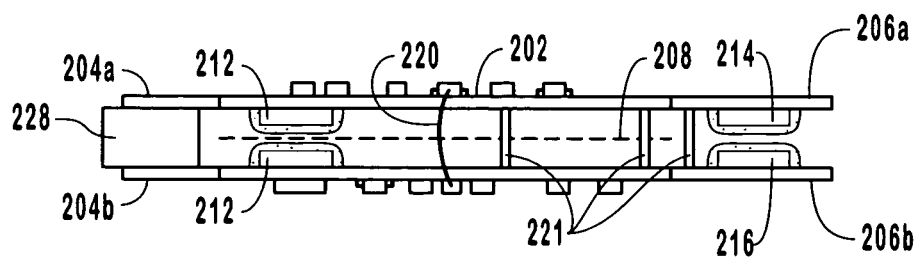
FIG. 3 shows the flexible circuit of FIGS. 2 and 3 folded over to fit in a module housing.

With reference now to FIG. 3, flexible circuit 200 is shown in a folded configuration. In this configuration, flexible member 202 is folded generally along a center line 208 (also shown in FIGS. 2A and 2B), so that electrical connectors 210 are on an outside of the folded structure. This configuration facilitates the easy connection of flexible circuit 200 to external devices. To assist with this connection, a stiffener 228 can optionally be inserted between first elongated section 204a and second elongated section 204b. By way of example and not limitation, the stiffener can be made of low cost printed circuit board material, such as phenolic material, waste epoxy-fiberglass laminate, or other suitable materials. The stiffener also serves the purpose of providing a firm surface to act as an "edge-card" connector in combination with electrical connectors 210. Many fiber-optic modules are "pluggable" meaning that they are intended to plug into a connector socket on a host router or switch motherboard using one edge of the printed circuit board as an "edge-card" connector. It will be understood that in other configurations, elongate section 204a and 204b may contact each other and function collectively as an "edge-card" connector without the use of a stiffener. Further, embodiments may utilize first elongated section 204a as one "edge-card" connector and second elongated section 204b as a second "edge-card" connector.

In addition to including structures to function as an "edge-card" connector, electrical connections can also be made across, around, or through flexible member 202 using, by way of example and not limitation, additional connecting wires 220 or pins 221. Those skilled in the art realize that there are machines which take a reel of pins and automatically drive a pin 221 through a pre-made hole in flexible member 202. These pins 221 can have a cross section that facilitates wedging the pin into flexible member 202. For instance, the pin can have a star cross section or some other cross section that facilitates attachment of the pin to the flexible member 212. One reason to use pins 221 instead of additional wires 220 is that sometimes, in high frequency applications, the long signal path used by the wires is not desired. The pins 221 provide a short path from one component to another.

While the exemplary embodiment of flexible circuit 200 is shown as folding in the middle to create a dual layered structure, those skilled in the art will realize that flexible circuit 200 can be fabricated from a flexible member that could be folded two or more times, depending on the configuration of the circuitry and the shape of flexible member 202. Additionally, the specific location of electrical components 212, whether SMT components, COB components, or other types of components, is arbitrary. It is anticipated that any configuration of electrical components disposed on a flexible circuit for use in a transceiver module falls within the scope of the exemplary embodiments of the present invention.

Figure 4:
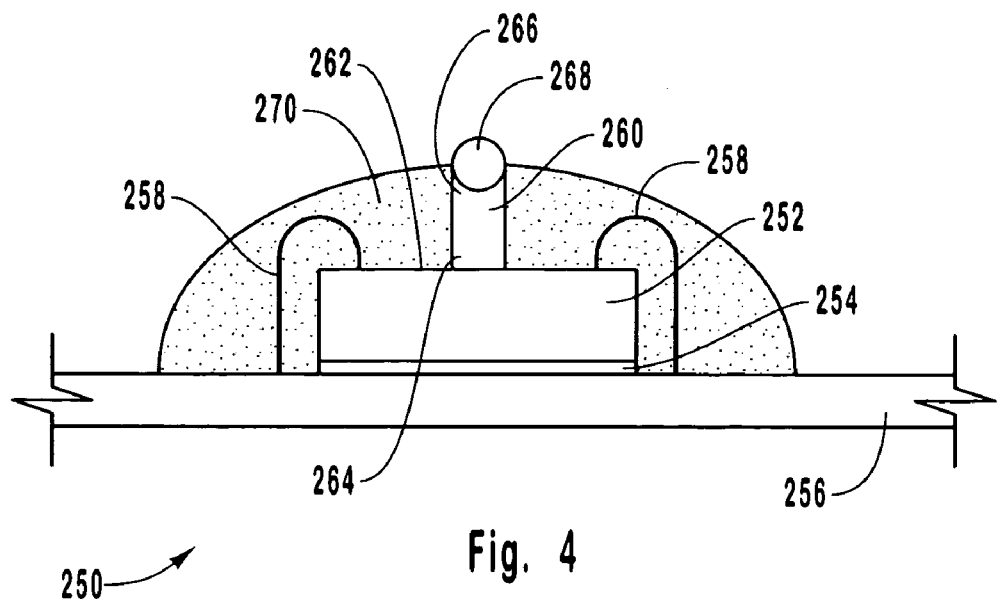
FIG. 4 shows a partial cross-sectional side view of an optoelectronic device mounted on a flexible circuit.

FIG. 4 shows one exemplary embodiment of an optoelectronic component secured to a flexible circuit, designated generally as reference numeral 250. The optoelectronic component 250 includes an optoelectronic device 252 mounted with an adhesive 254 on substrate 256, such as a printed circuit board, flexible circuit, or other substrate known to those of skill in the art. Extending from optoelectronic device 252 are a plurality of connecting wires 258 for making electrical connections between substrate 256 and optoelectronic device 252. These electrical wires 258 can carry or transport electrical signals to and from the optoelectronic device. For instance, wires 258 transmit electrical signals to optoelectronic device 252, while wires 258 can also transmit electrical signals from a photodiode. An optical conduit 260 mounts to a surface 262 of optoelectronic device 252 to facilitate the passing of light signals to or from device 252. The optical conduit 260 has a first end 264 that mounts to surface 262 and a second end 266 that receives an optical component 268. In an alternate exemplary embodiment, second end 266 is devoid of optical component 268. A resin or epoxy potting adhesive (glop top) 270 can be applied in a liquid form which then hardens over device 252, wires 258, and optical conduit 260 to secure them in place on substrate 256. Other materials, such as an optically clear adhesive or epoxy can also be used to protect device 252, wires 258, and optical conduit 260 on substrate 256.

The optoelectronic device 252 can be a laser diode, a photodiode, or other optoelectronic component that sends and/or receives data carrying light signals. If a laser diode is used, it can take the form of a vertical cavity surface emitting laser (VCSEL), a distributed feedback (DFB) laser, a light emitting diode (LED), or any other type of laser transmitter known in the art. The laser transmitter takes electronic data signals input from, for example, a data port, converts the electronic data signals to light signals, and transmits the light signals to some remote device via a fiber optic cable. If a photodiode is used, it receives transmitted light signals and converts the data carried within the light signals back into an electronic data stream for transmission.

The optical conduit 260 functions as a waveguide that channels electromagnetic radiation in a desired direction. The optical conduit 260 may have a uniform cross-section and optionally include a hole extending from the first end 264 toward the second end 416. For instance, in one configuration optical conduit 260 is a metallic tubular member. In another configuration, optical conduit 260 is a waveguide that can transmit electromagnetic radiation through a solid core thereof. It will be understood that various other configurations of optical conduit 260 are possible.

The first end 264 cooperates with device 252. In the illustrated configuration, first end 264 has a generally planar configuration to enable mounting to a window of device 252 when the same is a TOSA or ROSA, and more generally a laser transmitter or photodiode receiver. Optionally, first end 264 includes one or more optical coatings to aid with the transmission of electromagnetic radiation, such as light signals, between optical conduit 260 and device 252. Illustratively, the one or more coatings include, but are not limited to, antireflection coatings, polarization coatings, filters, combinations thereof or other coatings that may be used to change or control the optical characteristics of the light signals, for example, propagating between optical conduit 264 and device 252.

In one exemplary embodiment, optical component 268 mounts to second end 266 of optical conduit 260. The optical component 268 functions to focus or collimate the light signals traveling to/from optoelectronic device 252, respectively. By way of example and not limitation, optical component 268 can be a ball lens, a double convex lens, a single convex lens, or any other type of optical components that is designed to focus or collimate light. Such optical components are well known in the art. In an alternate exemplary embodiment, optical component 268 can be replaced with any clear material that passes a light signal of the desired frequency.

Generally, optical conduit 260 provides a corridor for the transmission of electromagnetic radiation, such as light signals to/from optoelectronic device 252. The optical conduit 260, therefore, can be made from a variety of materials and have a variety of configurations to achieve this function. The optical conduit 260 can be fabricated from, by way of example and not limitation, a metal, alloy, ceramic, plastic, glass, composite and the like.

Figure 5:
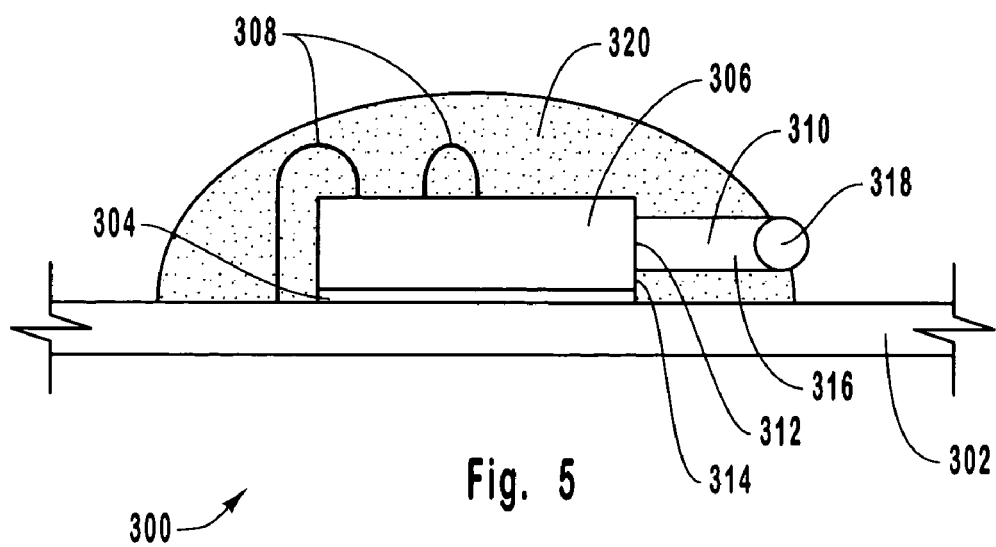
FIG. 5 shows a partial cross-sectional side view of an alternate configuration for mounting an optoelectronic device on a flexible circuit.

The optical conduit 260 protects the corridor from resin 270 applied to secure optoelectronic device 252, wires 258, and optical conduit 260 in place. When resin 270 hardens, it provides protection for the various components, which in turn makes it easier to then secure the flexible circuit in a module housing. One example of a type of laser that could be used with the configuration shown in FIG. 4 is the vertical cavity surface emitting laser (VCSEL). Additionally, most types of photodiodes would use the configuration shown in FIG. 4, since the light sensitive area is located on the top of the die not the side edge (FIG. 5). If desired, additional structural components (not shown) can be embedded in resin 270 to provide for simple and quick attachment to a transceiver module housing.

An alternate embodiment showing another exemplary way to secure a component to a flexible circuit is shown in FIG. 5, and designated generally as reference numeral 300. Optoelectronic component 300 includes an optoelectronic device 306 mounted with an adhesive 304 on a substrate 302. Extending from optoelectronic device 306 are a plurality of connecting wires 308 for making electrical connections between substrate 302 and optoelectronic device 306. An optical conduit 310 has a first end 312 placed adjacent to a side 314 of optoelectronic device 306 to facilitate the passing of light signals, or other electromagnetic radiation, to or from device 306. Mounted to a second end 316 of optical conduit 310 can be an optical component 318. A resin 320 can be applied in a "glop top" liquid form which then hardens over device 306, wires 308, and optical conduit 310 to secure them in place on substrate 302.

The discussion of the components of FIG. 4 also applies to the components of FIG. 5. In the configuration of FIG. 5, optical component 310 mounts to side 314 of optoelectronic device 306, rather that the top surface of the device as illustrated in FIG. 4. Depending on the specific type of optoelectronic device used as part of the module, i.e., the type of laser, this embodiment provides the same utility discussed above with respect to FIG. 4. By way of example and not limitation, both DFB Lasers and Fabre-Perot (FP) lasers can be used in the configuration shown in FIG. 5. In both of these lasers, the light emerges from the faceted side edge of the die, not the top of the semiconductor die (FIG. 4). As with the embodiment illustrated in FIG. 4, additional structural components (not shown) can be embedded in resin 320 to provide for simple and quick attachment to a transceiver module housing.

The exemplary embodiments shown in FIGS. 4 and 5 offer some advantages over the prior art. They are easier and cheaper to manufacture than, for example, a TO-cap that performs essentially the same function. When used in conjunction with flexible circuits in optoelectronic modules, they are cheaper to manufacture than printed circuit boards having flexible circuit connections. The exemplary embodiments eliminate the need to provide for expensive and time consuming connections between a printed circuit board and the optical sub-assemblies.)

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. An optical sub-assembly comprising:
   an optoelectronic device attached to a substrate;
   an optical conduit having a first end abutting said optoelectronic device and a second end, said optical conduit optically communicating with said optoelectronic device such that a signal can pass through said optical conduit;
   a wire electrically connecting said optoelectronic device to said substrate; and
   a protective material substantially encasing all exposed surfaces of said optoelectronic device and said wire, and encasing at least a portion of said optical conduit, such that said protective material does not interfere with said signal.

2. The optical sub-assembly of claim 1, wherein said optoelectronic device is a laser diode.

3. The optical sub-assembly of claim 1, further comprising an optical component mounted to said optical conduit.

4. The optical sub assembly of claim 1, wherein said optoelectronic device is a photodiode.

5. The optical sub-assembly of claim 1, wherein said first end of said optical conduit is attached to a top of said optoelectronic device.

6. The optical sub-assembly of claim 1, wherein said first end of said optical conduit is attached to a side of said optoelectronic device.

7. The optical sub-assembly of claim 1, wherein said substrate is a flexible circuit.

8. The optical sub-assembly of claim 1, wherein said protective material is a resin.

9. The optical sub-assembly of claim 1, wherein said protective material is an epoxy.

10. The optical sub-assembly of claim 9, wherein said epoxy is optically transparent.

11. The optical sub-assembly of claim 1, further comprising at least one optical coating applied to at least one of said first end and said second end of said optical conduit.

12. An optical sub-assembly comprising:
    a laser diode attached to a substrate;
    a cylindrical member having a first end abutting said laser diode;
    a wire electrically connecting said laser diode to said substrate; and
    a protective material substantially encasing all exposed surfaces of said laser diode and said wire, and encasing at least a portion of said cylindrical member, such that said protective material does not interfere with a light signal transmitted from said laser diode.

13. The optical sub-assembly of claim 12, further comprising an optical component mounted to a second end of said cylindrical member.

14. The optical sub-assembly of claim 13, wherein said optical component is a lens.

15. The optical sub-assembly of claim 12, wherein said first end of said cylindrical member is attached to a top of said laser diode.

16. The optical sub-assembly of claim 12, wherein said first end of said cylindrical member abuts a side of said laser diode.

17. The optical sub-assembly of claim 12, wherein said substrate is a flexible circuit.

18. The optical sub-assembly of claim 12, wherein said cylindrical member is a tube comprising any one of a metal, a plastic, an acrylic, a glass, or a composite material.

19. The optical sub-assembly of claim 12, wherein said protective material is a resin.

20. The optical sub-assembly of claim 12, wherein said protective material is an epoxy.

21. The optical sub-assembly of claim 20, wherein said epoxy is optically transparent.

22. An optical sub-assembly comprising:
    an optoelectronic device attached to a substrate;
    a cylindrical member having a first end abutting said optoelectronic device, said cylindrical member capable of directing an electromagnetic radiation signal either to or from said optoelectronic device;
    a wire electrically connecting said optoelectronic device to said substrate;
    a transparent material secured to a second end of said cylindrical member; and
    a protective material substantially encasing all exposed surfaces of said optoelectronic device and said wire, and encasing at least a portion of said cylindrical member.

23. The optical sub-assembly of claim 22, wherein said transparent material is a lens.

24. The optical sub-assembly of claim 22, wherein said first end of said cylindrical member mounts to a top of said photodiode.

25. The optical sub-assembly of claim 22, wherein said cylindrical member is a tube comprising any one of metal, plastic, acrylic, glass, or a composite material.

26. The optical sub-assembly of claim 22, wherein said protective material is a resin.

27. The optical sub-assembly of claim 22, wherein said protective material is an epoxy.

28. The optical sub-assembly of claim 27, wherein said epoxy is optically transparent.

* * * * *

UNITED STATES PATENT AND TRADEMARK OFFICE
CERTIFICATE OF CORRECTION

PATENT NO. : 7,306,377 B2  Page 1 of 2
APPLICATION NO. : 10/836134
DATED : December 11, 2007
INVENTOR(S) : Ellison It is certified that error appears in the above-identified patent and that said Letters Patent is hereby corrected as shown below:

Drawings
Replace FIG. 2B with the figure depicted below, wherein the reference number for the flexible circuit 200 is added

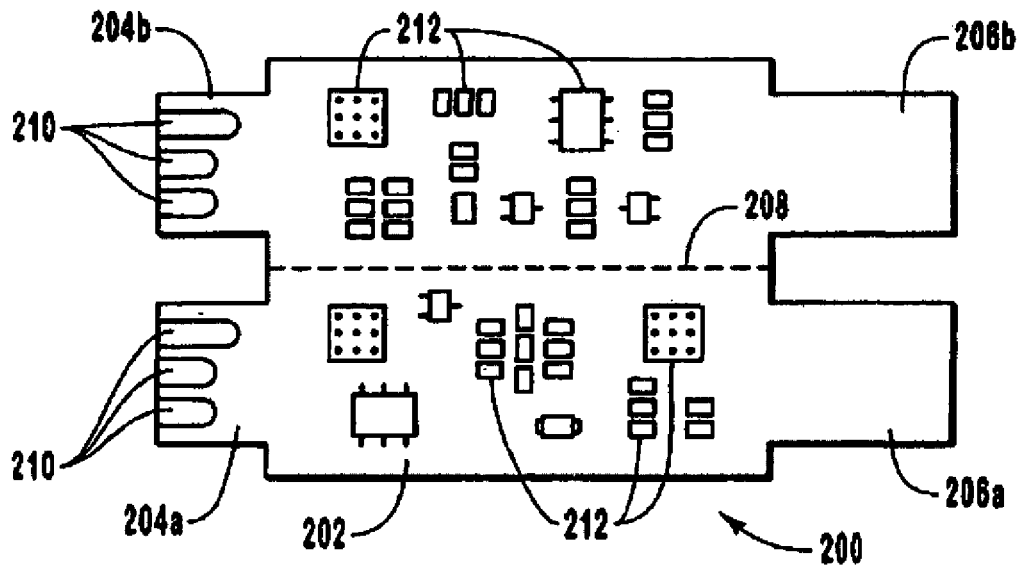

Fig. 2B

Signed and Sealed this

Thirteenth Day of July, 2010

David J. Kappos
*Director of the United States Patent and Trademark Office*

CERTIFICATE OF CORRECTION (continued)
U.S. Pat. No. 7,306,377 B2

Column 3
Line 65, change "FIG. 2;" to --FIG. 2A--
Line 66, change "FIGS. 2 and 3" to --FIGS. 2A and 2B--

Column 5
Line 15, change "known to" to --known to,--

Column 6
Line 53, after "connectors 210" add --(shown in FIGS. 2A and 2B)--
Line 63, after "connectors 210" add --(shown in FIGS. 2A and 2B)--

Column 7
Line 18, change "212" to --202--

Column 8
Line 12, change "416" to --266--
Line 62, after "the die" add --and--

Column 9
Line 40, change "sub-assemblies.)" to --sub-assemblies.--